US012700572B2

(12) United States Patent (10) Patent No.: US 12,700,572 B2
Jin et al. (45) Date of Patent: Aug. 4, 2026

(54) PLASMA CONTROL DEVICE

(71) Applicant: Samsung Electronics Co., Ltd.,
Suwon-si (KR)

(72) Inventors: Ha Dong Jin, Suwon-si (KR); Nam Kyun Kim, Suwon-si (KR); Sung-Yeol Kim, Suwon-si (KR); Sung Yong Lim, Suwon-si (KR); Kyung-Sun Kim, Suwon-si (KR); Dong Hyeon Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/937,516

(22) Filed: Nov. 5, 2024

(65) Prior Publication Data

US 2025/0246407 A1     Jul. 31, 2025

(30) Foreign Application Priority Data

Jan. 29, 2024     (KR) ........................ 10-2024-0013146

(51) Int. Cl.
*H01J 37/32*          (2006.01)
(52) U.S. Cl.
CPC .. *H01J 37/32183* (2013.01); *H01J 37/32146* (2013.01); *H01J 37/32642* (2013.01)
(58) Field of Classification Search
CPC ........... H01J 37/32146; H01J 37/32642; H01J 37/32715; H01J 2237/334; H01J 37/32174; H01J 37/32183; H01J 37/32091; H01J 37/32568; H01J 37/32165; H01J 37/3244; H01J 37/32669; H01J 2237/2007; H01J 2237/332; H01J 37/321; H01J 37/3211; H01J 37/32449; H01J 37/32577; H01J 37/3266; H01J 37/32706; H01J 2237/002; H01J 37/32082; H01J 37/32128; H01J 37/32137; H01J 37/32541; H01J 37/32724; H01J 37/32834; H01J 37/32917;

(Continued)

(56) References Cited

U.S. PATENT DOCUMENTS 8,251,011 B2     8/2012   Yamazawa et al.
10,249,476 B2     4/2019   Marakhtanov et al.

(Continued)

FOREIGN PATENT DOCUMENTS

KR       10-2023-0054890 A       4/2023

*Primary Examiner* — Monica C King
(74) *Attorney, Agent, or Firm* — Muir Patent Law, PLLC

(57) ABSTRACT

A plasma control device includes a chamber, in which a plasma process is performed, including a first electrode and a second electrode, a power generator connected to the second electrode and applying a bias voltage to the chamber, and a first impedance modulator connected to the first electrode and controlling the bias voltage applied to the chamber. The first impedance modulator includes a first impedance circuit unit including first impedance elements connected with each other in parallel and first switches respectively connected to the first impedance elements in series, and a first switch controller configured to receive a first pulse signal with a period, generate pulse unit signals shifted relative to each other by the period divided by a number of the first impedance elements, and control on/off timing of each of the first switches using the pulse unit signals.

20 Claims, 14 Drawing Sheets

(58) Field of Classification Search
CPC ........... H01J 37/32935; H01J 2237/327; H01J
2237/3347; H01J 37/32119; H01J
37/32522; H01J 37/32651; H01J
37/32697; H01J 37/32816; H01J
37/32889; H01J 1/00; H01J 2237/3343;
H01J 37/32155; H01J 37/32357; H01J
37/32458; H01J 37/32477; H01J
37/32495; H01J 37/32633; H01J
2237/0041; H01J 2237/0473; H01J
2237/152; H01J 2237/24507; H01J
2237/24564; H01J 2237/3346; H01J
37/32027; H01J 37/32192; H01J
37/32807; H01J 37/32926; H01J
37/32972; H01J 37/3299
See application file for complete search history.

(56)                    References Cited

U.S. PATENT DOCUMENTS

| | | | |
|---|---|---|---|
| 11,342,159 B2 | 5/2022 | Long et al. | |
| 11,462,390 B2 | 10/2022 | Shoeb et al. | |
| 2020/0144032 A1 * | 5/2020 | Ulrich ............... | H01J 37/32183 |
| 2020/0168439 A1 * | 5/2020 | Bhutta .............. | H01J 37/32183 |
| 2021/0384009 A1 | 12/2021 | Kawakami et al. | |
| 2023/0091161 A1 | 3/2023 | Oh et al. | |
| 2023/0187175 A1 | 6/2023 | Kim et al. | |

* cited by examiner

PLASMA CONTROL DEVICE

CROSS-REFERENCE TO RELATED APPLICATION

This application claims priority from Korean Patent Application No. 10-2024-0013146 filed on Jan. 29, 2024 in the Korean Intellectual Property Office and all the benefits accruing therefrom under 35 U.S.C. 119, the contents of which in its entirety are herein incorporated by reference.

BACKGROUND

Technical Field

The present disclosure relates to a plasma control device.

Description of the Related Art

When a semiconductor device or a display device is manufactured, various processes such as etching, ashing, ion implantation, thin film deposition and cleaning are performed. Plasma may be used in these various processes.

In order to control ions activated by plasma, a bias voltage is applied to an electrode in a process chamber. The bias voltage induces a voltage onto a substrate through a chuck. The voltage induced onto the substrate may be controlled so that ion energy incident on the substrate may be precisely controlled. Therefore, etch selectivity and/or an aspect ratio of a contact hole or trench may be improved.

BRIEF SUMMARY

An object of the present disclosure is to provide a plasma control device in which process characteristics are improved.

The objects of the present disclosure are not limited to those mentioned above and additional objects of the present disclosure, which are not mentioned herein, will be clearly understood by those skilled in the art from the following description of the present disclosure.

According to an aspect of the present disclosure, a plasma control device includes a chamber, in which a plasma process is performed, including a first electrode and a second electrode which oppose each other, a power generator connected to the second electrode and applying a bias voltage to the chamber, and a first impedance modulator connected to the first electrode and controlling the bias voltage applied to the chamber. The first impedance modulator includes a first impedance circuit unit including a plurality of first impedance elements connected with each other in parallel and a plurality of first switches respectively connected to the plurality of first impedance elements in series, and a first switch controller configured to receive a first pulse signal with a period, generate a plurality of pulse unit signals shifted relative to each other by the period divided by a number of the plurality of first impedance elements, and control on/off timing of each of the plurality of first switches using the plurality of pulse unit signals.

According to an aspect of the present disclosure, a plasma control device includes a chamber, in which a plasma process is performed, including a first electrode and a second electrode which oppose each other, a first impedance modulator connected to the first electrode and operated based on a pulse period, and a power generator connected to the second electrode and applying a voltage to the chamber. The first impedance modulator includes an impedance circuit unit including a plurality of switches and a switch controller controlling on/off timing of each of the plurality of switches. The switch controller configured to control on/off timing of each of the plurality of switches receiving a plurality of pulse unit signals with a unit time of the pulse period, determine an impedance of the impedance circuit unit using the plurality of pulse unit signals, and control the voltage applied to the chamber based on the impedance of the impedance circuit unit.

According to an aspect of the present disclosure, a plasma control device includes a chamber in which a plasma process is performed, including an upper electrode, a support member disposed in the chamber, on which a substrate is seated, a first impedance modulator connected to the upper electrode and controlling a bias voltage applied to the chamber, and a direct current power generator connected to a lower electrode in the support member and applying the bias voltage to the chamber. The first impedance modulator includes a first impedance circuit unit including a plurality of first impedance elements connected with each other in parallel and a plurality of first switches respectively connected to the plurality of first impedance elements in series, and a plurality of first pulse voltage controllers respectively connected to the plurality of first switches and controlling on/off timing of each of the plurality of first switches by supplying a first pulse voltage to each of the plurality of first switches.

Details of the other embodiments are included in the detailed description and drawings.

BRIEF DESCRIPTION OF THE DRAWINGS

The above and other aspects and features of the present disclosure will become more apparent by describing in detail exemplary embodiments thereof with reference to the attached drawings, in which:

FIG. 8 is a view illustrating a voltage applied to a chamber by the operation of the impedance modulator of FIG. 7;

DETAILED DESCRIPTION OF THE DISCLOSURE

Figure 1:
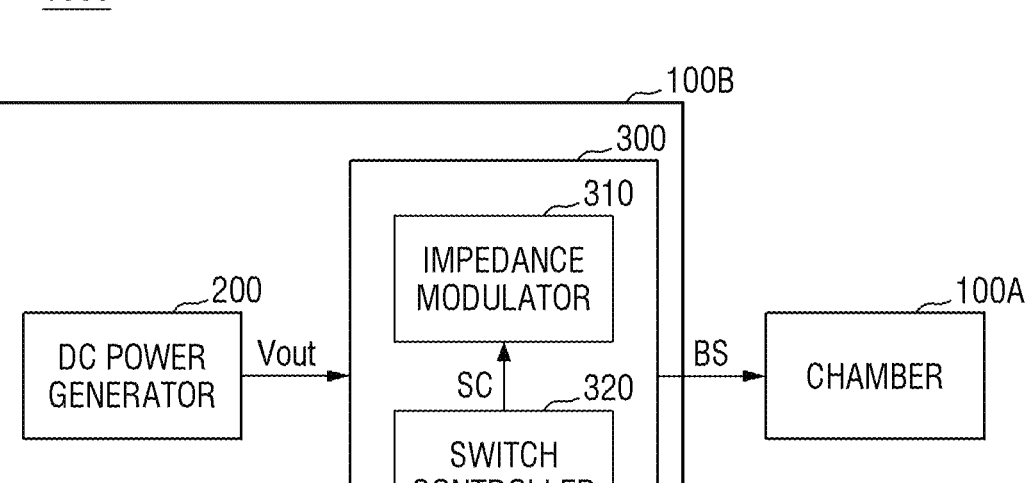
FIG. 1 is an exemplary block diagram illustrating a plasma control device according to some embodiments.

FIG. 1 is an exemplary block diagram illustrating a plasma control device according to some embodiments. FIG.

Figure 3:
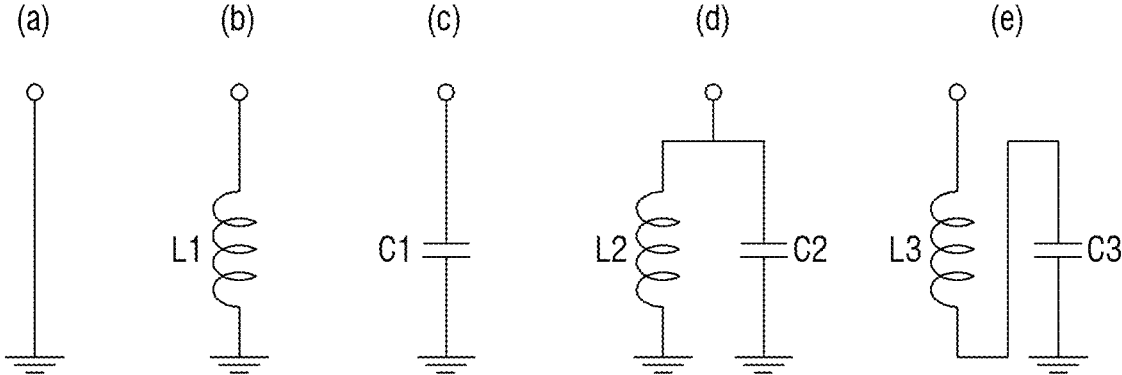
FIG. 3 is an exemplary view illustrating impedance elements according to some embodiments.
Figure 4:
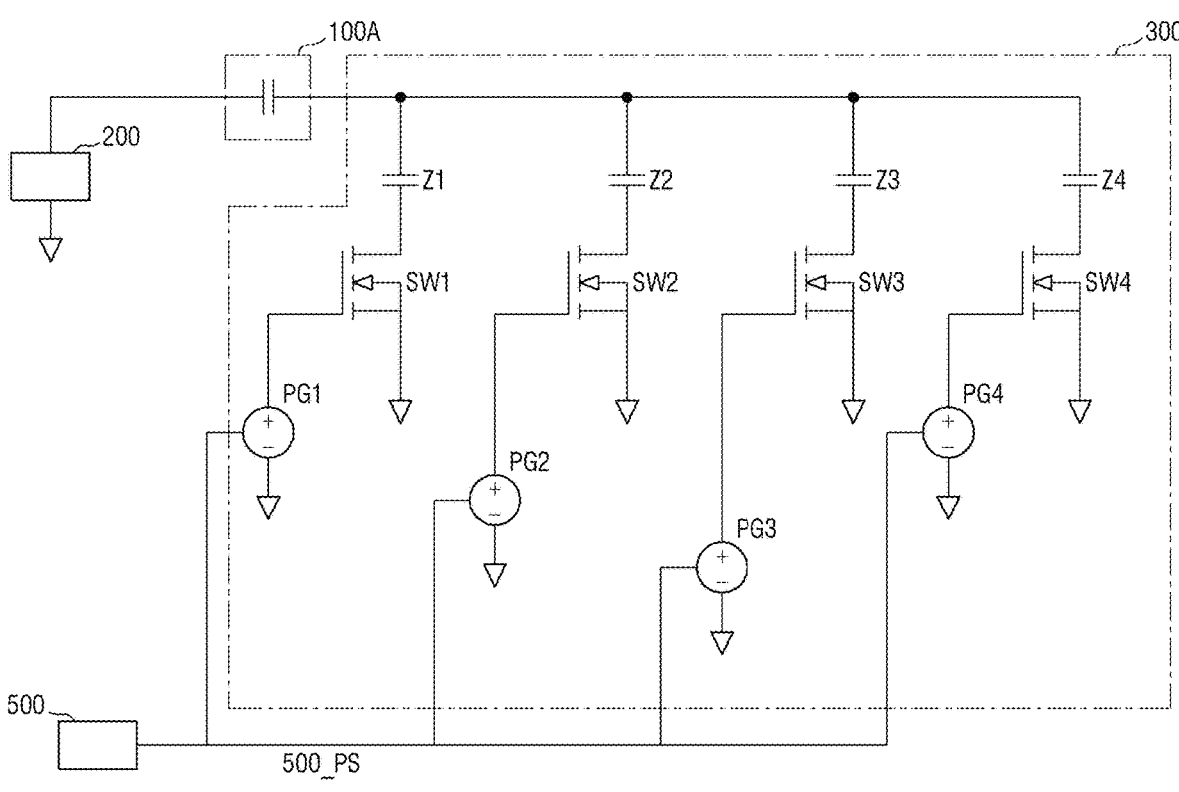
FIG. 4 is an exemplary view illustrating an impedance circuit unit according to some embodiments.
Figure 5:
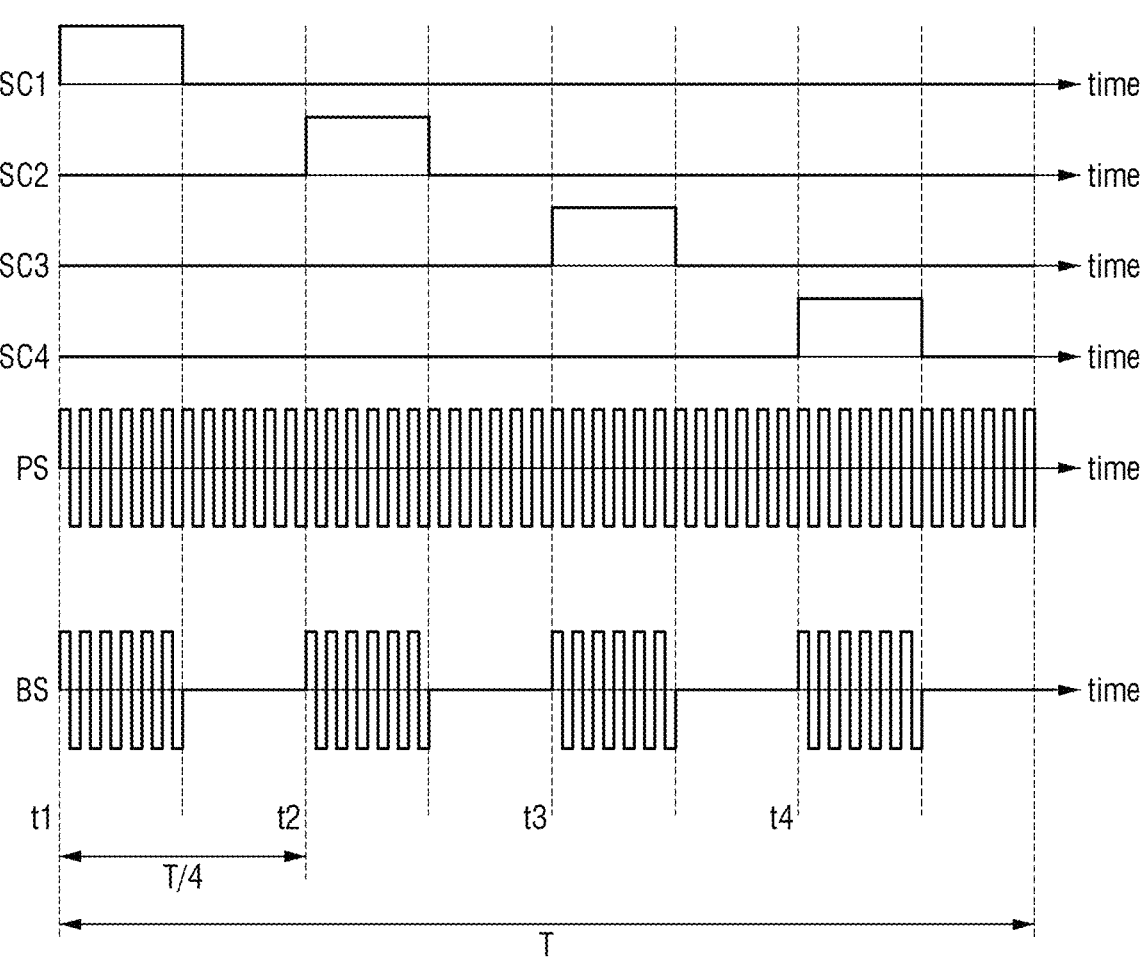
FIG. 5 is a view illustrating an operation of an impedance modulator according to some embodiments.
Figure 6:
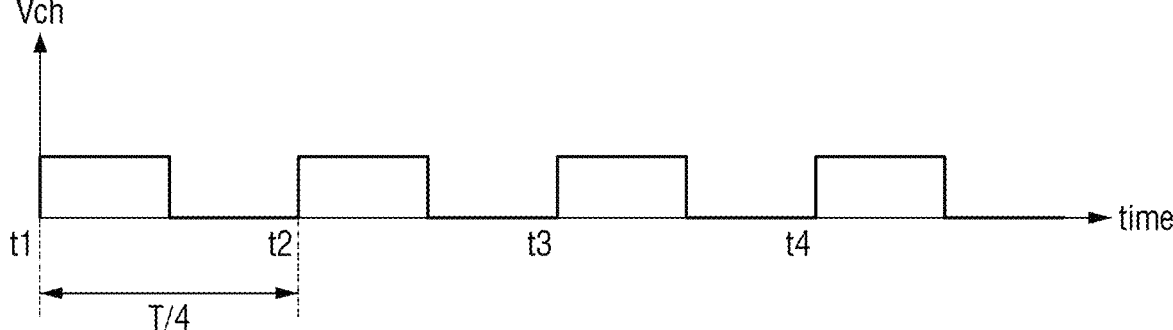
FIG. 6 is a view illustrating a voltage applied to a chamber by an operation of the impedance modulator of FIG. 5.

2 is an exemplary view illustrating a plasma control device according to some embodiments. FIG. 3 is an exemplary view illustrating impedance elements according to some embodiments. FIG. 4 is an exemplary view illustrating an impedance circuit unit according to some embodiments. FIG. 5 is a view illustrating an operation of an impedance modulator according to some embodiments. FIG. 6 is a view illustrating a voltage applied to a chamber by an operation of the impedance modulator of FIG. 5. For reference, in FIGS. 5 and 6, a vertical axis may represent a voltage V, and a horizontal axis may represent time.

Figure 2:
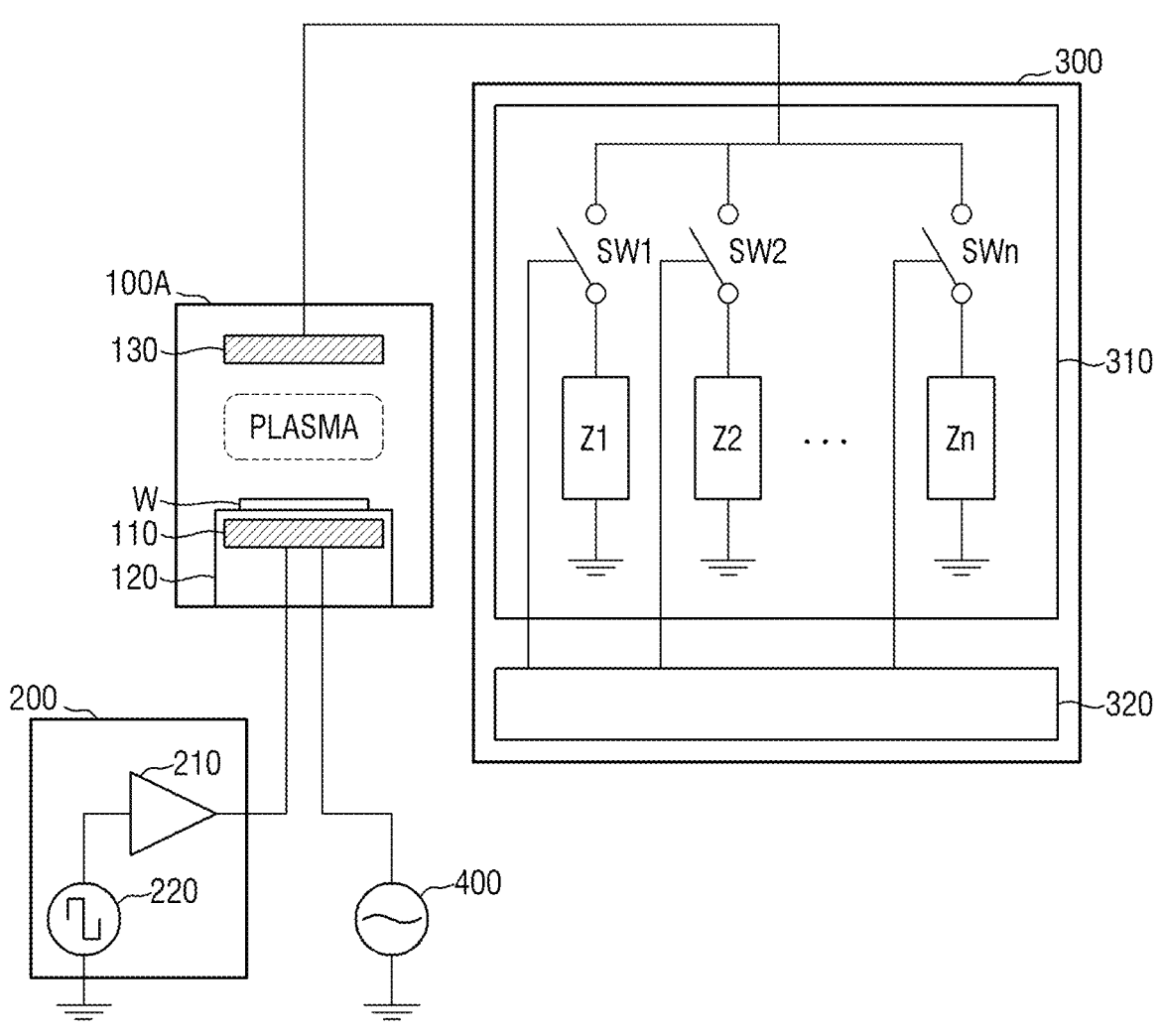
FIG. 2 is an exemplary view illustrating a plasma control device according to some embodiments.

Referring to FIGS. 1 and 2, plasma control devices 1000 and 1000A according to some embodiments may include a chamber 100A and a bias power supply unit 100B. The bias power supply unit 100B may include a power generator 200 and a first impedance modulator 300, and the first impedance modulator 300 may include a first impedance circuit unit 310 and a first switching controller 320

The plasma control device 1000 according to some embodiments may perform a plasma process using capacitively coupled plasma (CCP).

The chamber 100A may provide an inner space for performing a plasma process. The plasma process may include, for example, etching, ashing, ion implantation, thin film deposition, cleaning, and the like, but is not limited thereto. The chamber 100A may be, for example, a cylindrical vacuum chamber, and the chamber 100A may include a metal such as aluminum and stainless steel, but is not limited thereto. A support member 120 may be positioned in the chamber 100A, and a substrate W on which a plasma process is to be processed may be seated on the support member 120.

The bias power supply unit 100B may supply a bias power for controlling ion energy of plasma to the chamber 100A. When the bias power is provided to a first electrode 110 adjacent to the support member 120, a voltage may be induced to the substrate W disposed on the first electrode 110. Therefore, the voltage of the substrate W may be controlled in accordance with the bias power, and thus the ion energy of the plasma generated in the chamber 100A may be controlled. The bias power according to some embodiments may not have a continuous wave (CW) waveform, but may have a pulsing waveform having an on-period and an off-period.

The bias power supply unit 100B may include a power generator 200 and a first impedance modulator 300. The power generator 200 may generate a direct current voltage Vout for generating a bias power signal BS. In some embodiments, the power generator 200 may refer to a power generator for controlling directivity of ions generated by plasma.

The plasma control device 1000A according to some embodiments may further include a source power generator 400. The source power generator 400 may be connected to the first electrode 110 and be involved in forming plasma in the chamber 100A.

Although not shown in detail, in the plasma control device according to some embodiments, the first impedance modulator 300 may receive a pulse signal 500_PS from a pulse signal generator 500. The frequency of the pulse signal 500_PS may be, for example, several kHz. The bias power supply unit 100B may generate a power signal (PS of FIG. 5) having a pulsing waveform. The frequency of each of the power signal (PS of FIG. 5) and the bias power signal (BS of FIG. 5) may be hundreds of kHz. Meanwhile, waveforms of the power signal (PS of FIG. 5) and the bias power signal (BS of FIG. 5) are not limited to those shown in FIG. 5.

The first impedance modulator 300 may generate a bias power signal BS having a pulsing waveform by filtering the power signal (PS of FIG. 5) by using the pulse signal 500_PS provided from the pulse signal generator 500. The first switching controller 320 may generate a switching signal SC that controls the bias voltage applied to the chamber 100A based on the pulse signal 500_PS. In some embodiments, the switching signal SC may include pulse unit signals (SC1 to SC4 of FIG. 5) that will be described later.

The configuration and operation of the first impedance modulator 300 will be described later in detail with reference to FIGS. 3 to 6.

Although not shown in detail, the power signal (PS of FIG. 5) may have a direct current (DC) pulse unit having a positive voltage value and a negative voltage value within one period. The frequency, a duty ratio and a voltage level of the DC pulse unit may be adjusted by the first impedance modulator 300.

The first electrode 110, the support member 120 and a second electrode 130, which oppose one another, may be disposed in the chamber 100A. In some embodiments, the first electrode 110 may refer to a lower electrode, and the second electrode 130 may refer to an upper electrode.

The support member 120 may serve as a susceptor for supporting the substrate W. For example, the support member 120 may be an electrostatic chuck for maintaining the substrate W with an electrostatic force. The first electrode 110 may be disposed in the support member 120, and the second electrode 130 may be disposed on the support member 120.

For example, the first electrode 110 may be connected to the power generator 200, and the second electrode 130 may be connected to the first impedance modulator 300. The bias power may be applied to the chamber 100A through the first electrode 110. The second electrode 130 may be an electrode that becomes a reference potential of the bias power.

The power generator 200 may include an amplifier 210 and a DC power generator 220. The DC power generator 220 may generate a DC power signal of a square wave shape. The power generator 200 may provide the power signal (PS of FIG. 5) to the chamber 100A through the amplifier 210.

The first impedance circuit unit 310 may include a plurality of first impedance elements Z1 to Zn and a plurality of first switches SW1 to SWn respectively connected to the plurality of first impedance elements Z1 to Zn in series.

The first switch controller 320 may control on/off timing of each of the plurality of first switches SW1 to SWn by using the pulse signal 500_PS provided from the pulse signal generator 500 as shown in FIG. 4.

Referring to FIG. 3, the first impedance circuit unit 310 may include various types of first impedance elements Z1 to Zn and their combination to control plasma. For example, the first impedance elements Z1 to Zn may be provided in a shape in which passive elements are connected to each other in parallel.

For example, referring to FIG. 3(*a*), the first impedance circuit unit 310 may have a shorted form. In some embodiments, referring to FIG. 3(*b*), the first impedance circuit unit 310 may include a single inductor L1, and referring to FIG. 3(*c*), the first impedance circuit unit 310 may include a single capacitor C1.

In some embodiments, referring to FIG. 3(*d*), the first impedance circuit unit 310 may include an inductor L2 and a capacitor C2 which are connected with each other in parallel, and referring to FIG. 3(*e*), the first impedance circuit unit 310 may include an inductor L3 and a capacitor C3 which are connected with each other in series.

However, the shapes, the number and the combination of the impedance elements Z1 to Zn are exemplary, and are not limited to the shown examples.

Referring to FIG. 4, the first impedance circuit unit 310 may include first to fourth impedance elements Z1 to Z4 and first to fourth switches SW1 to SW4. The first switch controller 320 may include first to fourth pulse controllers PG1 to PG4. However, the number of impedance elements, the number of switches and the number of pulse controllers are only exemplary, and are not limited thereto.

Referring to FIG. 5, the first to fourth pulse controllers PG1 to PG4 may apply pulse unit signals SC1 to SC4 having different timings to the first to fourth switches SW1 to SW4, respectively, within a period T of the pulse signal 500_PS. The pulse unit signals SC1 to SC4 may be signals for providing a pulse voltage to each of the first to fourth switches SW1 to SW4. In some embodiments, the pulse controller may be referred to as a pulse voltage controller. In some embodiments, the first switch controller 320, which includes the first to fourth pulse controllers PG1 to PG4, may receive a pulse signal 500_PS with a period T and generate pulse unit signals SC1 to SC4. For example, each of the pulse unit signals SC1 to SC4 may receive the pulse signal 500_PS with period T and generate the pulse unit signals SW1 to SW4, each shifted by one fourth of the period T relative to each other. Each of the pulse unit signals SW1 to SW4 may have a high level having one eighth of the period T and a low level during the remaining time of the period T (i.e., a pulse width of one eighth of the period T). The number of impedance elements and switches is not limited thereto. In some embodiments, the first switch controller 320 may include eight impedance elements and eight switches connected thereto, and receive the pulse signal 500_PS with the period T and generate eight pulse unit signals, each shifted by one eighth of the period T relative to each other. In some embodiments, the first switch controller 320 may include N impedance elements and N switches, where N represents a number of the impedance elements and switches in the first switch controller 320, and generate N pulse unit signals, each shifted by one Nth of the period T relative to each other.

For example, the first pulse controller PG1 may apply the first pulse unit signal SC1 to the first switch SW1 at the first timing t1. The second pulse controller PG2 may apply the second pulse unit signal SC2 to the second switch SW2 at the second timing t2 after a predetermined time has elapsed from the first timing t1.

The third pulse controller PG3 may apply the third pulse unit signal SC3 to the third switch SW3 at the third timing t3 after a predetermined time has elapsed from the second timing t2. The fourth pulse controller PG4 may apply the fourth pulse unit signal SC4 to the fourth switch SW4 at the fourth timing t4 after a predetermined time has elapsed from the third timing t3.

For example, the predetermined time may be obtained by dividing the period of the pulse signal by four (T/4), but is not limited thereto.

The first switch controller 320 may control impedance of the first impedance circuit unit 310 by respectively providing the first to fourth pulse unit signals (SC1 to SC4 of FIG. 5) to the first to fourth switches SW1 to SW4.

The first switch controller 320 may control the bias voltage applied to the chamber 100A by controlling a ratio between the impedance of the first impedance circuit unit

310 and impedance of the chamber 100A (i.e., the equivalent impedance of plasma generated and maintained in the chamber 100A).

In detail, impedances of the first to fourth impedance elements Z1 to Z4 may be varied by the first switch controller 320. For example, the impedance of the first impedance circuit unit 310 may be varied by controlling the first to fourth impedance elements Z1 to Z4 using the control of the first switch control 320.

For example, the first switch controller 320 may determine the impedance of the first impedance circuit unit 310 by controlling the on/off timing of each of the first to fourth switches SW1 to SW4 which turns on during a unit time (e.g., T/4) of a pulse period.

At the first timing t1, as the first pulse unit signal SC1 is applied to the first switch SW1, the on/off state of the first switch SW1 may be controlled. At the second timing t2, as the second pulse unit signal SC2 is applied to the second switch SW2, the on/off state of the second switch SW2 may be controlled.

At the third timing t3, as the third pulse unit signal SC3 is applied to the third switch SW3, the on/off state of the third switch SW3 may be controlled. At the fourth timing t4, as the fourth pulse unit signal SC4 is applied to the fourth switch SW4, the on/off state of the fourth switch SW4 may be controlled.

In this case, as the on/off timing of the first to fourth switches SW1 to SW4 is controlled in an interleaving manner, the impedance of each of the first to fourth impedance elements Z1 to Z4 may vary. Therefore, the impedance of the first impedance circuit unit 310 may be determined, and the bias power applied to the chamber 100A may be controlled based on the determined impedance.

For example, the first to fourth switches SW1 to SW4 may be controlled to be synchronized with each other by the first switch controller 320.

In some embodiments, the first to fourth switches SW1 to SW4 may be controlled independently of one another by the first switch controller 320. That is, the first to fourth switches SW1 to SW4 may be controlled to be asynchronous with one another.

FIG. 6 is a view illustrating a waveform of a voltage Vch applied to a chamber. For reference, the waveform of FIG. 6 is an envelope value of the bias power signal BS of FIG. 5, and a magnitude of the voltage Vch applied to the chamber is not limited to that shown in FIG. 6.

Referring to FIG. 6, the timing at which the bias power signal BS is applied to the chamber 100A may be controlled by the first switch controller 320. That is, the timings t1 to t4 at which a voltage is applied to the chamber 100A in the pulse period T may be controlled differently depending on the unit time T/4 of the pulse period.

Meanwhile, the operations of the first switch controller 320 may be performed by a computer that is activated or configured by one or more computer programs stored in a computer memory or acquired through a computer network.

Figure 7:
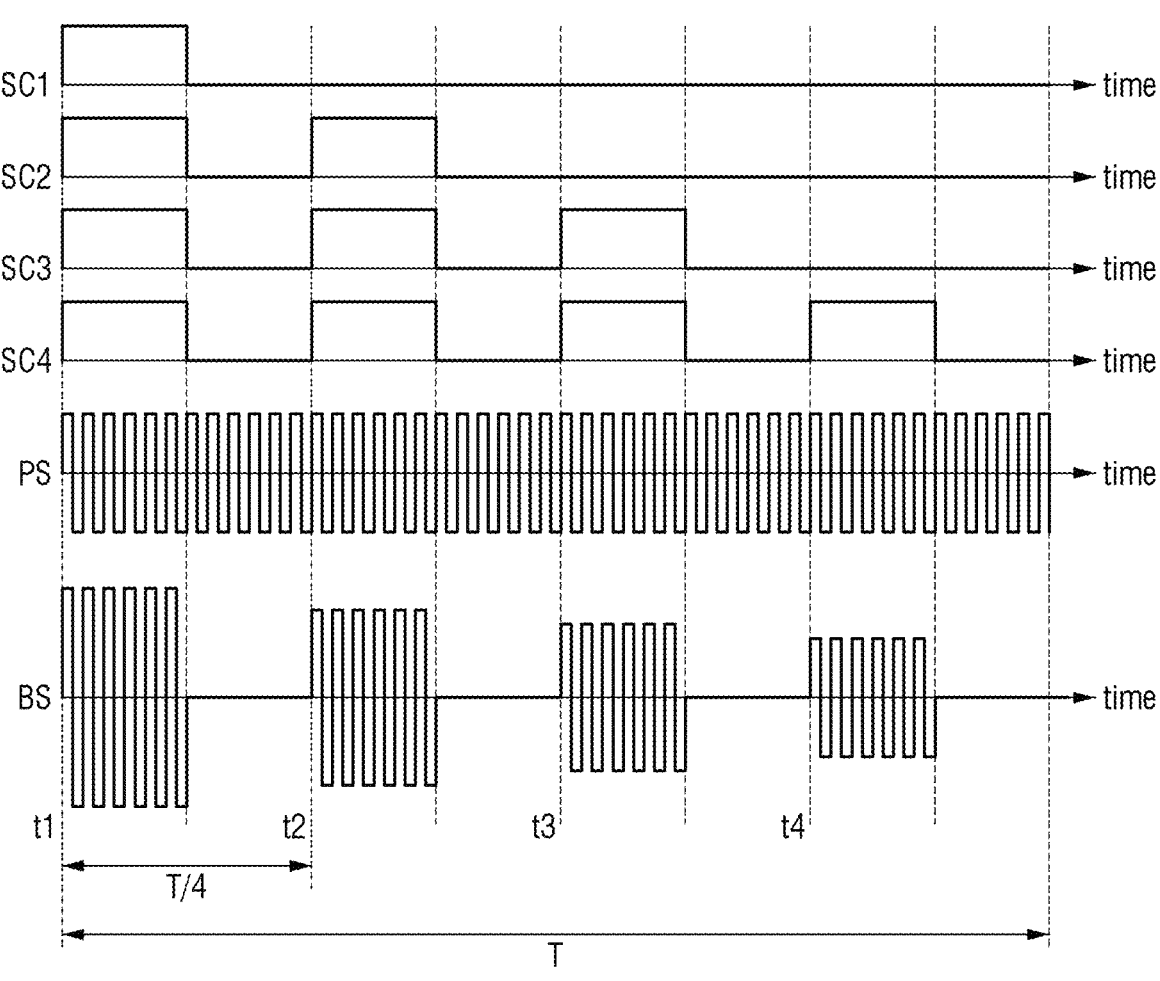
FIG. 7 is a view illustrating an operation of an impedance modulator according to some embodiments.
Figure 8:
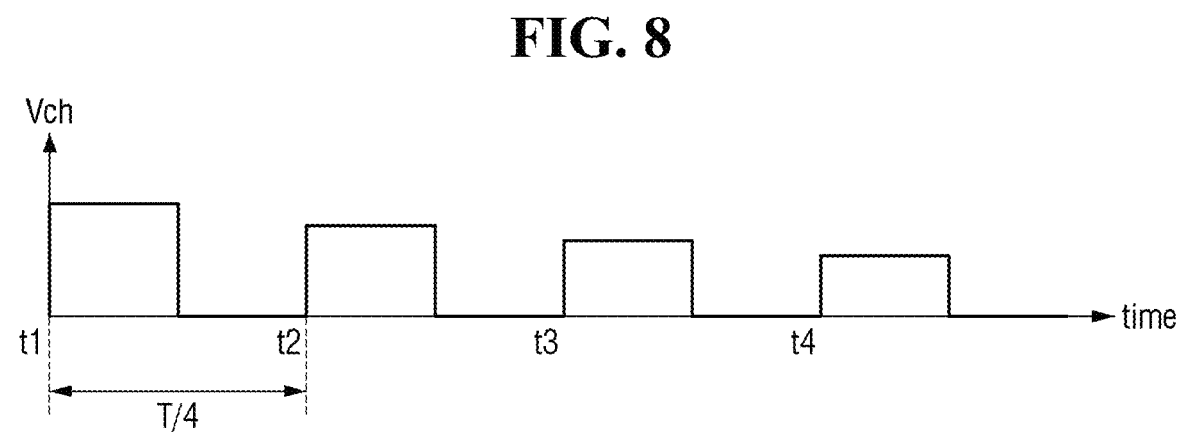

FIG. 7 is a view illustrating an operation of an impedance modulator according to some embodiments. FIG. 8 is a view illustrating a voltage applied to a chamber by the operation of the impedance modulator of FIG. 7. For reference, a vertical axis of FIGS. 7 and 8 may represent a voltage V, and a horizontal axis may represent time. For convenience, the following description will be based on differences from the above description made with reference to FIGS. 1 to 6.

Referring to FIG. 7, the first to fourth pulse controllers PG1 to PG4 may respectively apply pulse unit signals SC1 to SC4 of timings, of which at least portions overlap each other within the period T of the pulse signal, to the first to fourth switches SW1 to SW4. The pulse unit signals SC1 to SC4 may be signals for allowing each of the first to fourth pulse controllers PG1 to PG4 to provide the pulse voltage to each of the first to fourth switches SW1 to SW4.

For example, the first pulse controller PG1 may apply the first pulse unit signal SC1 to the first switch SW1 at the first timing t1. The second pulse controller PG2 may apply the second pulse unit signal SC2 to the second switch SW2 at the first timing t1 and the second timing t2.

The third pulse controller PG3 may apply the third pulse unit signal SC3 to the third switch SW3 at the first timing t1, the second timing t2 and the third timing t3. The fourth pulse controller PG4 may apply the fourth pulse unit signal SC4 to the fourth switch SW4 at the first timing t1, the second timing t2, the third timing t3 and the fourth timing t4.

The first switch controller 320 may control the impedance of the first impedance circuit unit 310 by respectively providing the first to fourth pulse unit signals (SC1 to SC4 of FIG. 7) to the first to fourth switches SW1 to SW4.

The first switch controller 320 may control the bias voltage applied to the chamber 100A by controlling a ratio between the impedance of the first impedance circuit unit 310 and the impedance of the chamber 100A (i.e., the equivalent impedance of plasma generated and maintained in the chamber 100A).

In detail, the impedances of the first to fourth impedance elements Z1 to Z4 may be varied by the first switch controller 320. For example, the impedance of the first impedance circuit unit 310 may be varied by controlling the first to fourth impedance elements Z1 to Z4 using the control of the first switch control 320.

For example, the first switch controller 320 may determine the impedance of the first impedance circuit unit 310 by controlling the on/off timing of each of the first to fourth switches SW1 to SW4 which turns on during the unit time (e.g., T/4) of the pulse period.

At the first timing t1, as the first pulse unit signal SC1 is applied to the first switch SW1, the on/off state of the first switch SW1 may be controlled. At the first and second timings t1 and t2, as the second pulse unit signal SC2 is applied to the second switch SW2, the on/off state of the second switch SW2 may be controlled.

At the first to third timings t1 to t3, as the third pulse unit signal SC3 is applied to the third switch SW3, the on/off state of the third switch SW3 may be controlled. At the first to fourth timings t1 to t4, as the fourth pulse unit signal SC4 is applied to the fourth switch SW4, the on/off state of the fourth switch SW4 may be controlled.

As the on/off timing of the first to fourth switches SW1 to SW4 is controlled, the impedance of each of the first to fourth impedance elements Z1 to Z4 may vary. As the impedances of the first to fourth impedance elements Z1 to Z4 are controlled, the impedance of the first impedance circuit unit 310 may be determined. The bias power applied to the chamber 100A may be controlled based on the determined impedance.

Referring to FIG. 8, a magnitude of the bias power applied to the chamber 100A may be controlled by the first switch controller 320. That is, a voltage level of the chamber 100A within the pulse period T may be controlled differently depending on the unit time T/4 of the pulse period.

In detail, since the number of switches SW1 to SW4 that are turned on at each of the first to fourth timings t1 to t4 is different, the voltage level applied to the chamber 100A may be different at each timing.

For example, the voltage level at the first timing t1, when all four switches SW1 to SW4 turn on, may be greater than the voltage level at the third timing t3, when the three switches SW2 to SW4 turn on. The voltage level at the second timing t2, when the three switches SW2 to SW4 turn on, may be greater than the voltage level at the third timing t3, when the two switches SW3 to SW4 turn on. The voltage level at the third timing t3, when the two switches SW3 to SW4 turn on, may be greater than the voltage level at the fourth timing t4, when the fourth switch SW4 turns on.

Meanwhile, the waveform of FIG. 8 is an envelope value of the bias power signal BS of FIG. 7, and the magnitude of the voltage Vch applied to the chamber is not limited to the shown example.

Figure 9:
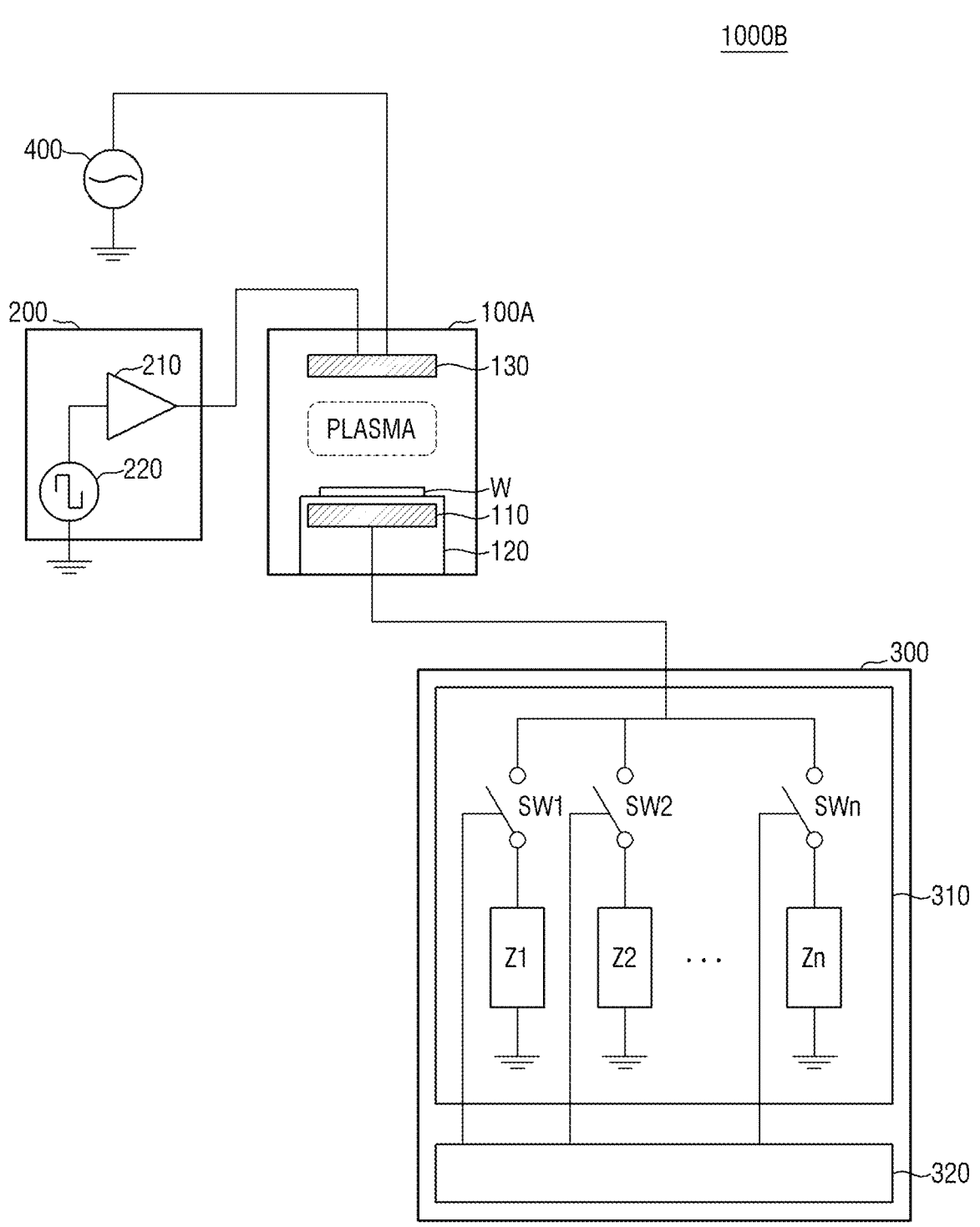
FIG. 9 is an exemplary view illustrating a plasma control device according to some embodiments.

FIG. 9 is an exemplary view illustrating a plasma control device according to some embodiments. For convenience, the following description will be based on differences from the above description made with reference to FIGS. 1 to 8.

Referring to FIG. 9, a first electrode 110 of a plasma control device 1000B according to some embodiments may be connected to a first impedance modulator 300, and a second electrode 130 may be connected to a power generator 200. A bias power may be applied to the chamber 100A through the second electrode 130. The first electrode 110 may be an electrode that becomes a reference potential of the bias power.

The plasma control device 1000B according to some embodiments may further include a source power generator 400. The source power generator 400 may be connected to the second electrode 130 and may be involved in forming plasma in the chamber 100A.

Figure 10:
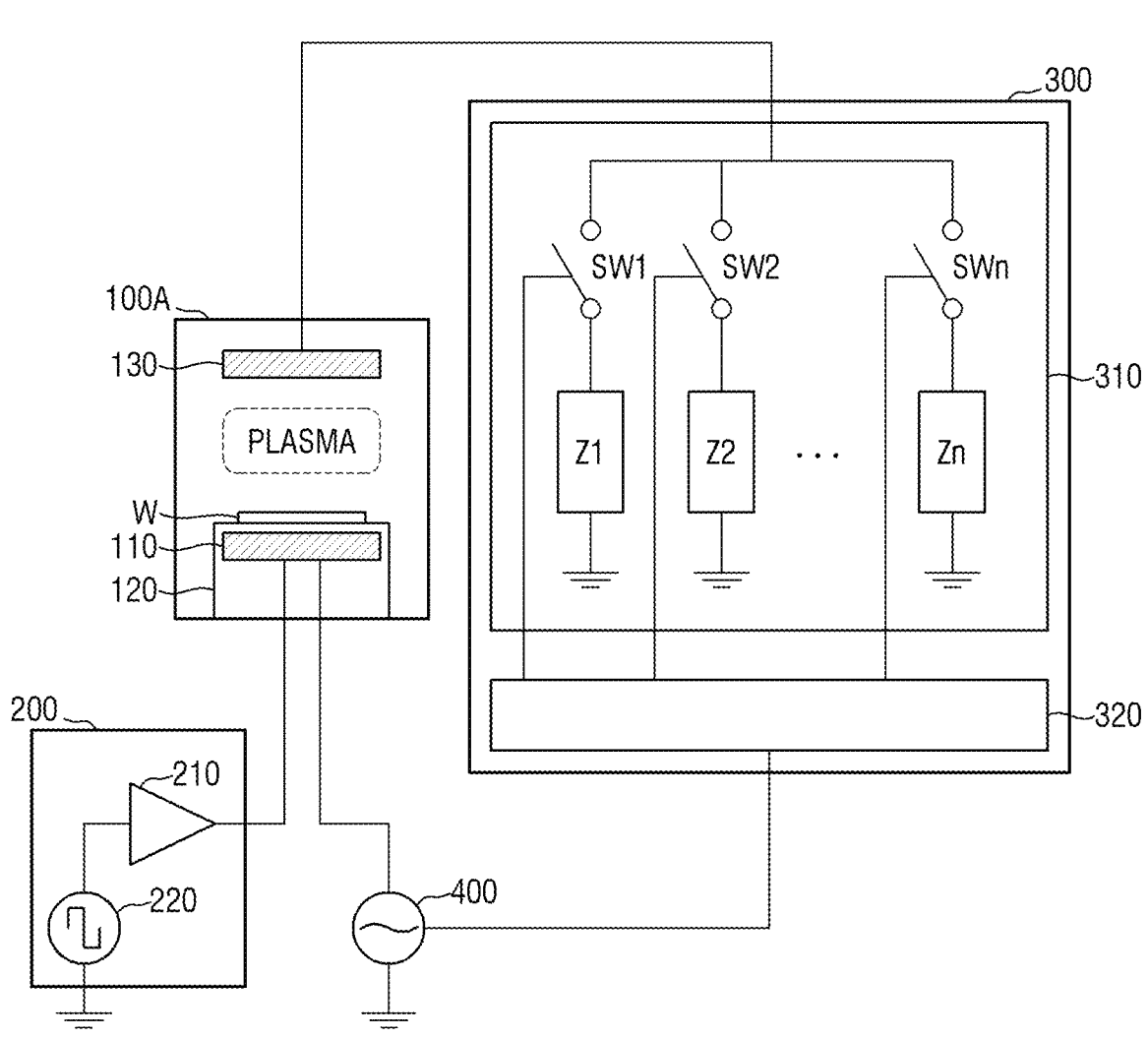
FIG. 10 is an exemplary view illustrating a plasma control device according to some embodiments.
Figure 11:
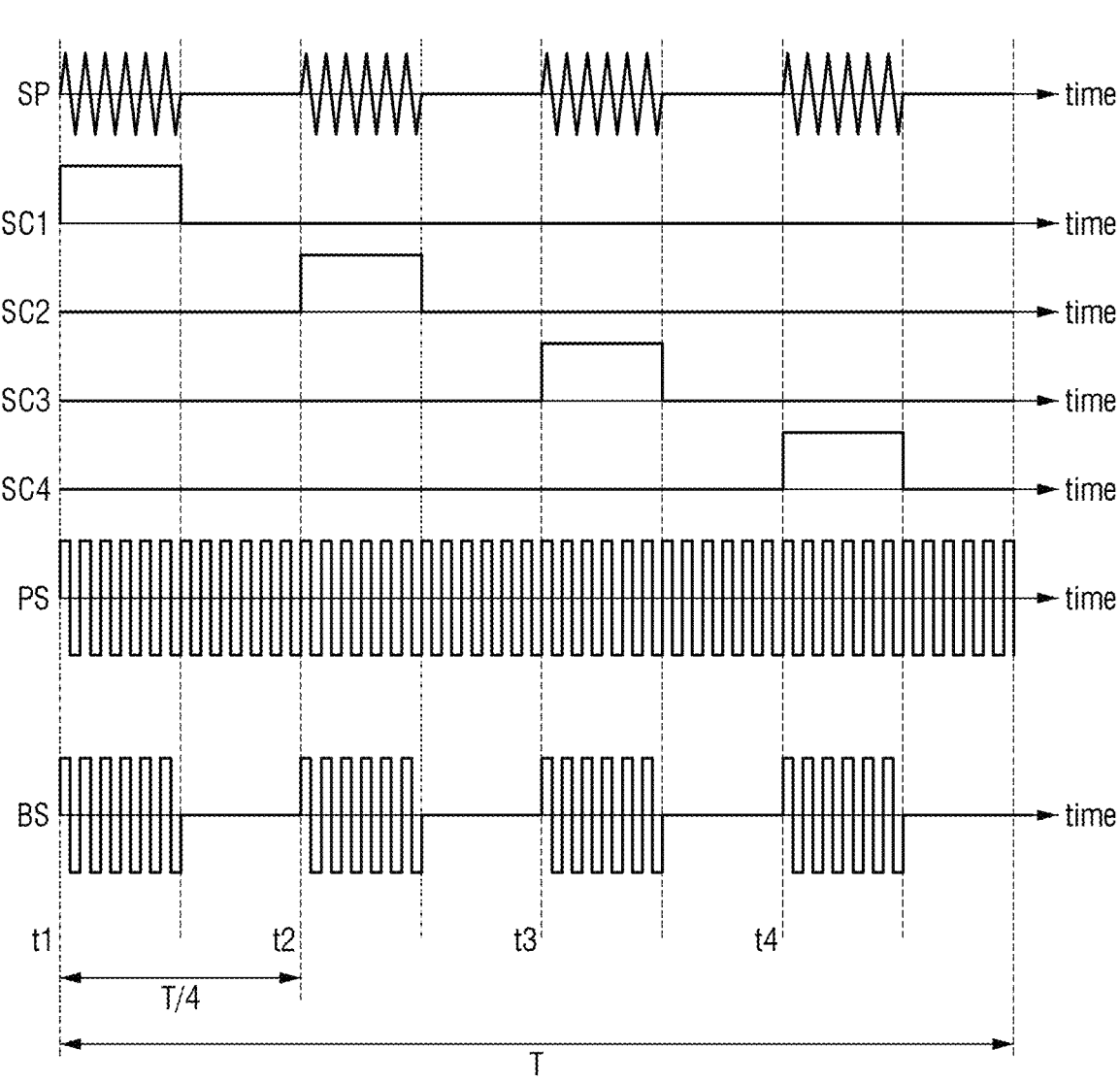
FIG. 11 is a view illustrating an operation of an impedance modulator according to some embodiments.

FIG. 10 is an exemplary view illustrating a plasma control device according to some embodiments. FIG. 11 is a view illustrating an operation of an impedance modulator according to some embodiments. For convenience, the following description will be based on differences from the above description made with reference to FIGS. 1 to 9. In FIG. 11, a unit of the source power signal SP may be watt W.

Referring to FIG. 10, a source power generator 400 of a plasma control device 1000C according to some embodiments may be involved in forming plasma in the chamber 100A by applying a source power signal (SP of FIG. 11) to the first electrode 110. The frequency of the source power signal (SP of FIG. 11) may be, for example, several tens of MHz.

The first switching controller 320 may generate a switching signal for controlling a bias voltage applied to the chamber 100A based on the source power signal (SP of FIG. 11) provided from the source power generator 400. In some embodiments, the switching signal may include pulse unit signals (SC1 to SC4 of FIG. 11) generated to be synchronized with the source power signal (SP of FIG. 11).

Figure 12:
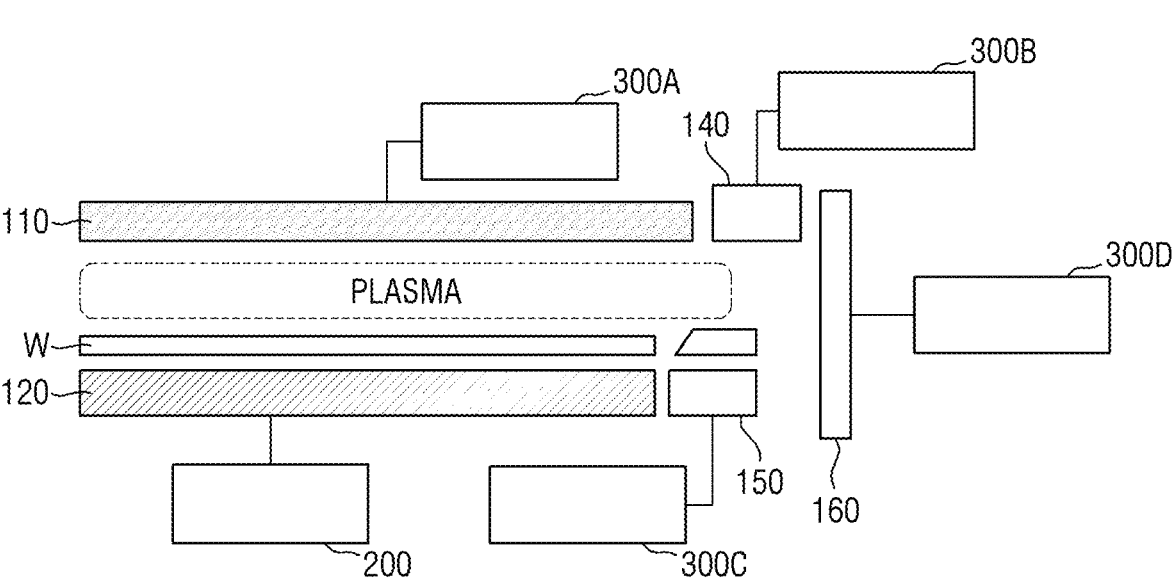
FIG. 12 is an exemplary view illustrating a plasma control device according to some embodiments.

FIG. 12 is an exemplary view illustrating a plasma control device according to some embodiments. For convenience, the following description will be based on differences from the above description made with reference to FIGS. 1 to 11.

Referring to FIG. 12, a plasma control device 1000D according to some embodiments may further include first and second edge rings 150 and 140, and second to fifth impedance modulators 300A to 300D.

The first edge ring 150 may be disposed to be adjacent to the first electrode 110 and the support member 120. The second edge ring 140 may be disposed above the first edge ring 150 and disposed to be adjacent to the second electrode 130. The first edge ring 150 and the second edge ring 140 may include a metal material and/or an insulating material.

The second impedance modulator 300A may be connected to a plasma sheath region, and the fifth impedance modulator 300D may be connected to a chamber wall 160.

The third impedance modulator 300B may be connected to the second edge ring 140, and the fourth impedance modulator 300C may be connected to the first edge ring 150. Although the impedance modulator is shown as being only connected to the edge ring in some embodiments, the present disclosure is not limited thereto. Although not shown in detail, for example, the impedance modulator may be also connected to a focus ring in the periphery of the substrate W.

Each of the second to fifth impedance modulators 300A to 300D may have the same configuration as the first impedance modulator 300 described above.

In detail, each of the second to fifth impedance modulators 300A-300D may include an impedance circuit unit including a plurality of impedance elements connected with each other in parallel and a plurality of switches respectively connected to the plurality of impedance elements in series, and a plurality of pulse voltage controllers for controlling on/off timing of each of the plurality of switches by supplying a pulse voltage to each of the plurality of switches.

Through the second to fifth impedance modulators 300A to 300D, locally controlling of the impedance of the plasma control device may be secured while minimizing electrical interference.

Figure 13:
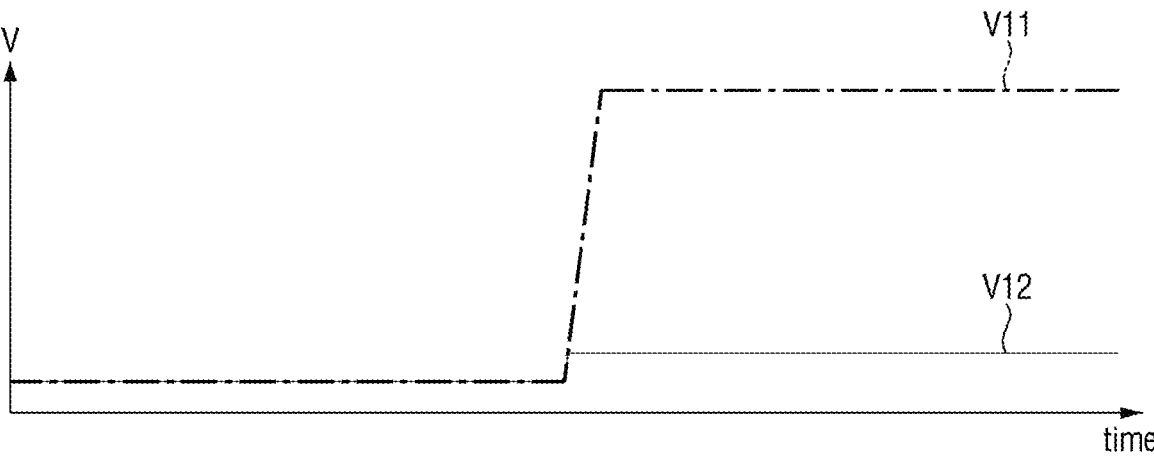
FIGS. 13 and 14 are views illustrating effects of a plasma control device according to some embodiments.
Figure 14:
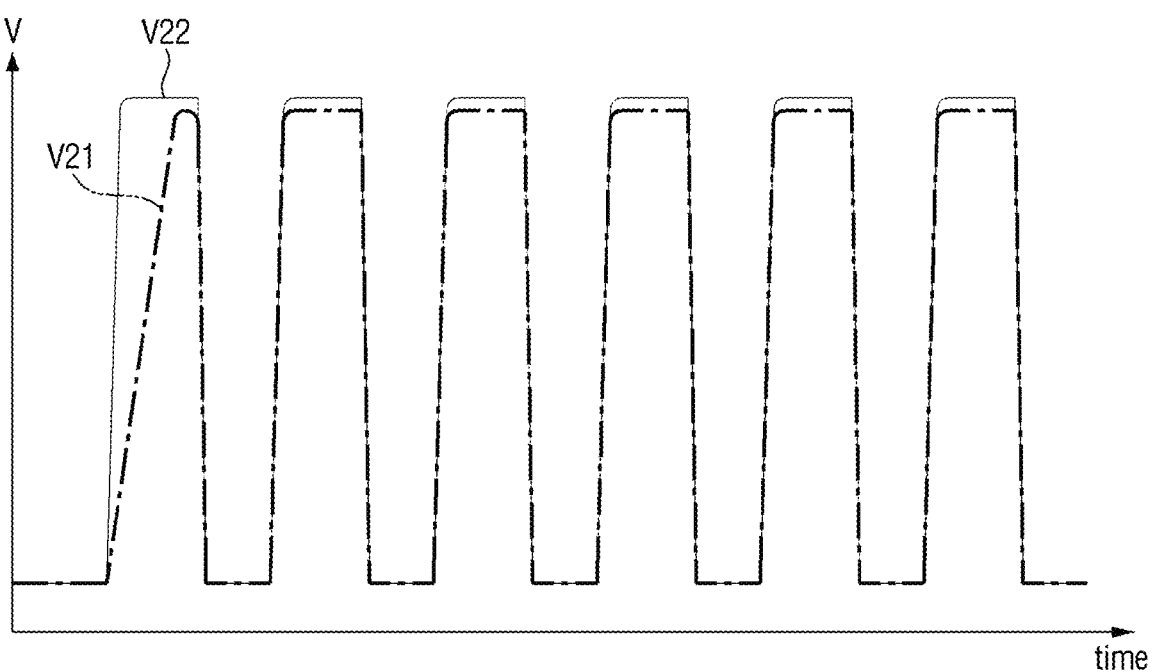

FIGS. 13 and 14 are views illustrating effects of a plasma control device according to some embodiments.

FIG. 13 is a view illustrating a pulse voltage V11 applied to a pulse controller of the related art and a pulse voltage V12 applied to a pulse controller according to some embodiments. Referring to FIG. 13, it is noted that a magnitude of the pulse voltage V12 applied to the pulse controller according to some embodiments is smaller than that of the pulse voltage V11 applied to the pulse controller of the related art.

That is, since the pulse controller according to some embodiments applies the pulse voltage applied to the impedance circuit unit in accordance with a unit signal within a pulse period, the voltage applied to the chamber may be controlled even with a smaller pulse voltage than the related art.

FIG. 14 is a view illustrating a voltage V21 applied to a chamber of the related art and a voltage V22 applied to the chamber according to some embodiments. Referring to FIG. 14, it is noted that a ramping time for applying a voltage to the chamber according to some embodiments is smaller than a ramping time for applying a voltage to the chamber of the related art. In some embodiments, the voltages V21 and V22 may be applied to the plasma in the chamber.

That is, according to some embodiments, since the magnitude of the pulse voltage applied to the impedance circuit unit is small, it may take a shorter ramping time than the related art.

Meanwhile, a magnitude of a voltage level V is not limited to that shown in FIG. 14.

Although the embodiments of the present disclosure have been described with reference to the accompanying drawings, it will be apparent to those skilled in the art that the present disclosure can be manufactured in various forms without being limited to the above-described embodiments and can be embodied in other specific forms without departing from the technical spirits and essential characteristics. Thus, the above embodiments are to be considered in all respects as illustrative and not restrictive.

What is claimed is:

1. A plasma control device comprising:
a chamber, in which a plasma process is performed, including a first electrode and a second electrode which oppose each other;
a power generator connected to the second electrode and applying a bias voltage to the chamber; and
a first impedance modulator connected to the first electrode and controlling the bias voltage applied to the chamber,
wherein the first impedance modulator includes:
a first impedance circuit unit including a plurality of first impedance elements connected with each other in parallel and a plurality of first switches respectively connected to the plurality of first impedance elements in series, and
a first switch controller configured to receive a first pulse signal with a period, generate a plurality of pulse unit signals shifted relative to each other by the period divided by a number of the plurality of first impedance elements, and control on/off timing of each of the plurality of first switches using the plurality of pulse unit signals.

2. The plasma control device of claim 1,
wherein the first switch controller includes a plurality of first pulse controllers, and
wherein the plurality of first pulse controllers receive the first pulse signal and generate and apply the plurality of pulse unit signals to the plurality of first switches, respectively, to control an impedance of the first impedance circuit unit.

3. The plasma control device of claim 1,
wherein the first switch controller controls the bias voltage applied to the chamber by controlling a ratio between an impedance of the first impedance circuit unit and an equivalent impedance of plasma in the chamber.

4. The plasma control device of claim 1,
wherein the first switch controller is configured to vary an impedance of the first impedance circuit unit by selectively controlling an on/off state of each of the plurality of first switches.

5. The plasma control device of claim 1,
wherein the first switch controller is configured to control the plurality of first switches synchronously.

6. The plasma control device of claim 1,
wherein the first switch controller is configured to control the plurality of first switches independently of each other.

7. The plasma control device of claim 1,
wherein the first switch controller is configured to control a magnitude of the bias voltage applied to the chamber.

8. The plasma control device of claim 1,
wherein a pulse width of each of the plurality of pulse unit signals is a value of the period divided by two times the number of the plurality of first impedance elements.

9. The plasma control device of claim 1, further comprising:
a second impedance modulator connected to a first edge ring adjacent to the first electrode; and
a third impedance modulator connected to a second edge ring adjacent to the second electrode.

10. The plasma control device of claim 9,
wherein the second impedance modulator includes a second impedance circuit unit including a plurality of second impedance elements connected to each other in parallel and a plurality of second switches respectively connected to the plurality of second impedance elements in series, and a second switch controller controlling on/off timing of each of the plurality of second switches based on a second pulse signal, and wherein the third impedance modulator includes a third impedance circuit unit including a plurality of third impedance elements connected to each other in parallel and a plurality of third switches respectively connected to the plurality of third impedance elements in series, and a third switch controller controlling on/off timing of each of the plurality of third switches based on a third pulse signal.

11. A plasma control device comprising:

a chamber, in which a plasma process is performed, including a first electrode and a second electrode which oppose each other;

a first impedance modulator connected to the first electrode and operated based on a pulse period; and a power generator connected to the second electrode and applying a voltage to the chamber, wherein the first impedance modulator includes an impedance circuit unit including a plurality of switches and a switch controller controlling on/off timing of each of the plurality of switches, and wherein the switch controller is configured to:

control on/off timing of each of the plurality of switches receiving a plurality of pulse unit signals with a unit time of the pulse period, and determine an impedance of the impedance circuit unit using the plurality of pulse unit signals, and control the voltage applied to the chamber based on the impedance of the impedance circuit unit.

12. The plasma control device of claim 11, wherein the switch controller controls the voltage applied to the chamber by controlling a ratio between the impedance of the impedance circuit unit and an equivalent impedance of plasma in the chamber.

13. The plasma control device of claim 11, wherein the first impedance modulator further includes a plurality of impedance elements respectively connected to the plurality of switches in series and connected with each other in parallel, and wherein the switch controller is configured to vary an impedance of the impedance circuit unit by selectively controlling an on/off state of each of the plurality of switches.

14. The plasma control device of claim 13, wherein a voltage level of the chamber is controlled differently by the switch controller depending on the on/off state of each of the plurality of switches.

15. The plasma control device of claim 13, wherein a timing at which the voltage is applied to the chamber is controlled by the switch controller differently depending on the on/off state of each of the plurality of switches.

16. The plasma control device of claim 11, further comprising:

a first edge ring adjacent to the first electrode; and a second edge ring adjacent to the second electrode.

17. The plasma control device of claim 16, further comprising:

a second impedance modulator connected to the first edge ring;

a third impedance modulator connected to the second edge ring; and a fourth impedance modulator connected to a chamber wall.

18. A plasma control device comprising:

a chamber in which a plasma process is performed, including an upper electrode;

a support member disposed in the chamber, on which a substrate is seated;

a first impedance modulator connected to the upper electrode and controlling a bias voltage applied to the chamber; and a direct current power generator connected to a lower electrode in the support member and applying the bias voltage to the chamber, wherein the first impedance modulator includes:

a first impedance circuit unit including a plurality of first impedance elements connected with each other in parallel and a plurality of first switches respectively connected to the plurality of first impedance elements in series, and a plurality of first pulse voltage controllers respectively connected to the plurality of first switches and controlling on/off timing of each of the plurality of first switches by supplying a first pulse voltage to each of the plurality of first switches.

19. The plasma control device of claim 18, wherein the plurality of first pulse voltage controllers determine an impedance of the first impedance circuit unit by controlling the on/off timing of each of the plurality of first switches with a unit time of a pulse period and control a bias voltage applied to the chamber based on the impedance of the first impedance circuit unit.

20. The plasma control device of claim 18, further comprising:

a second impedance modulator connected to a first edge ring adjacent to the upper electrode;

a third impedance modulator connected to a second edge ring adjacent to the support member; and a fourth impedance modulator connected to a chamber wall, wherein the second impedance modulator includes:

a second impedance circuit unit including a plurality of second impedance elements connected with each other in parallel and a plurality of second switches respectively connected to the plurality of second impedance elements in series, and a plurality of second pulse voltage controllers respectively connected to the plurality of second switches, controlling on/off timing of each of the plurality of second switches by supplying a second pulse voltage to each of the plurality of second switches, wherein the third impedance modulator includes:

a third impedance circuit unit including a plurality of third impedance elements connected with each other in parallel and a plurality of third switches respectively connected to the plurality of third impedance elements in series, and a plurality of third pulse voltage controllers respectively connected to the plurality of third switches, controlling on/off timing of each of the plurality of third switches by supplying a third pulse voltage to each of the plurality of third switches, and wherein the fourth impedance modulator includes:

a fourth impedance circuit unit including a plurality of fourth impedance elements connected with each other in parallel and a plurality of fourth switches respectively connected to the plurality of fourth impedance elements in series, and a plurality of fourth pulse voltage controllers respec-
tively connected to the plurality of fourth switches,
controlling on/off timing of each of the plurality of
fourth switches by supplying a fourth pulse voltage
to each of the plurality of fourth switches.

* * * * *